United States Patent [19]

Sonokawa

[11] Patent Number: 5,922,505
[45] Date of Patent: Jul. 13, 1999

[54] LITHOGRAPHIC PRINTING PLATE REQUIRING NO FOUNTAIN SOLUTION

[75] Inventor: Koji Sonokawa, Shizuoka, Japan

[73] Assignee: Fuji Photo Film Co., Ltd., Kanagawa, Japan

[21] Appl. No.: 08/709,522

[22] Filed: Sep. 6, 1996

[30] Foreign Application Priority Data

Sep. 14, 1995 [JP] Japan .................................. 7-236889

[51] Int. Cl.⁶ ....................................................... G03F 7/11
[52] U.S. Cl. ........................ 430/272.1; 430/303; 101/453
[58] Field of Search .................. 430/303, 272.1; 101/453

[56] References Cited

U.S. PATENT DOCUMENTS

| | | | |
|---|---|---|---|
| 4,225,663 | 9/1980 | Ball | 430/303 |
| 4,259,905 | 4/1981 | Abiko et al. | 430/303 |
| 4,342,820 | 8/1982 | Kinashi et al. | 430/11 |
| 4,496,647 | 1/1985 | Kawabe et al. | 430/303 |
| 4,755,445 | 7/1988 | Hasegawa | 430/303 |
| 5,159,879 | 11/1992 | Urabe et al. | 430/303 |
| 5,260,167 | 11/1993 | Sasa et al. | 430/303 |
| 5,397,681 | 3/1995 | Tsuda et al. | 430/303 |
| 5,503,074 | 4/1996 | Hirano et al. | 430/303 |

FOREIGN PATENT DOCUMENTS

| | | |
|---|---|---|
| 126192 | 11/1984 | European Pat. Off. . |
| 386777 | 9/1990 | European Pat. Off. . |
| 672950 | 4/1995 | European Pat. Off. . |
| 3816211 | 12/1988 | Germany . |
| 61-230151 | 10/1986 | Japan . |

*Primary Examiner*—Christopher G. Young
*Attorney, Agent, or Firm*—Burns, Doane, Swecker & Mathis, L.L.P.

[57] ABSTRACT

A lithographic printing plate requiring no fountain solution comprising a substrate having thereon a silicone rubber layer, wherein the silicone rubber layer comprises (A) 100 parts by weight of a linear diorganopolysiloxane having a trialkoxysilyl group at least at both ends, and (B) 0.1 to 50 parts by weight of a condensation catalyst.

8 Claims, No Drawings

LITHOGRAPHIC PRINTING PLATE REQUIRING NO FOUNTAIN SOLUTION

FIELD OF THE INVENTION

The present invention relates to a lithographic printing plate requiring no fountain solution comprising a substrate having thereon a silicone layer in which a coating solution for the silicone layer is excellent in aging stability.

BACKGROUND OF THE INVENTION

Various lithographic printing plates requiring no fountain solution for performing lithographic printing using no fountain solutions have been proposed. In particular, plates comprising a substrate having thereon a photosensitive layer and an ink-repellent layer have excellent characteristics. For example, various plates, such as positive, negative, ink-repellent upper layer, and ink-repellent lower layer types, have been proposed. Specifically, the positive ink-repellent upper layer type plates are described in JP-B-44-23042 (the term "JP-B" as used herein means an "examined Japanese patent publication") and JP-B-54-26923, and the positive ink-repellent lower layer type plates are described in JP-A-64-74541 (the term "JP-A" as used herein means an "unexamined published Japanese patent application") and JP-A-1-149043. Furthermore, the negative ink-repellent upper layer type plates are described in JP-B-46-16044, JP-B-61-54222 and JP-A-63-88556, and the negative ink-repellent lower layer type plates are described in JP-B-47-2361, JP-B-56-14976 and JP-A-1-173027. With the recent progress of digitalization of the plate-making process, lithographic printing plates requiring no fountain solution comprising a substrate having thereon a photosensitive layer and an ink-repellent layer have been proposed. Plates comprising silicone rubber as the ink-repellent layer for use in such lithographic printing plates are described in, for example, JP-B-54-26923, JP-B-55-22781, JP-B-56-23150 and JP-A-2-236550. Plates comprising a fluorine resin as the ink-repellent layers are described in, for example, JP-A-58-215411 and JP-A-2-103047. Among them, silicone rubber is more preferably used from the viewpoint of ink repellency.

The silicone rubber layer for use in the lithographic printing plates is usually obtained by partially crosslink-curing a polymer mainly comprising a polysiloxane skeleton with a crosslinking agent. The method for curing the silicone rubber layers includes a condensation method in which a polysiloxane having a hydroxyl group at both ends are crosslinked with a silane compound having at least 3 hydrolytic functional groups directly bonded to a silicon atom to form silicone rubber (e.g., JP-B-56-23150, JP-A-54-54702, JP-A-61-230151).

However, when the condensation silicone rubber layer is prepared by using a highly reactive silane compound as the crosslinking agent, the crosslinking reaction proceeds in the solution state because of the moisture in the air, resulting in gelation of a coating solution for the silicone rubber layer within several hours after solution preparation. Furthermore, when a less reactive silane compound is used as the crosslinking agent, it is disadvantageous because the silicone rubber layer is poor in curing characteristics after coating.

SUMMARY OF THE INVENTION

Therefore, an object of the invention is to provide a lithographic printing plate requiring no fountain solution comprising a silicone rubber layer having good characteristics which is provided by applying a coating solution for a condensation silicone rubber layer having sufficient aging stability, and crosslinking-curing it.

This and other objects of the present invention have been attained by a lithographic printing plate having no fountain solution comprising a substrate having thereon a silicone rubber layer, wherein the silicone rubber layer comprises (A) 100 parts by weight of a linear diorganopolysiloxane having a trialkoxysilyl group at least at both ends, and (B) 0.1 to 50 parts by weight of a condensation catalyst (hereinafter referred to as "the waterless lithographic printing plate of the present invention").

DETAILED DESCRIPTION OF THE INVENTION

The present invention will be illustrated in detail below.

The waterless lithographic printing plate of the present invention has a silicone layer and a sensitive material layer. Examples of the sensitive material layer include various layers such as a photosensitive layer and a thermal-sensitive layer, and primer layers may be provided just on the substrate if necessary.

The silicone layer of the present invention is described.
Silicone Rubber Layer:

In the present invention, a condensation silicone rubber provided by curing a composition comprising the following components (A) and (B) in the following ratio is used as the silicone rubber layer.
Composition:

(A) 100 parts by weight of a linear diorganopolysiloxane having trialkoxysilyl group at least at both ends (number average molecular weight: 3,000 to 1,000,000);

(B) 0.1 to 50 parts by weight of a condensation catalyst.

The progress of the crosslinking reaction in the coating solution for the silicone rubber layer can be inhibited by using the composition containing the above components in the above ratio. As a result, a sufficiently stable coating solution can be provided, and the silicone rubber layer which is excellent in curing characteristics of a coated film can be provided. If the component (B) is less than 0.1 parts by weight, the curing characteristics of the coated film are deteriorated; on the other hand, the component (B) is more than 50 parts by weight, the coating solution is gelled within several hours.

Component (A) (Linear diorganopolysiloxane having trialkoxysilyl groups at least at both ends):

The diorganopolysiloxane of the component (A) for use in the present invention is preferably represented by the following formula (I):

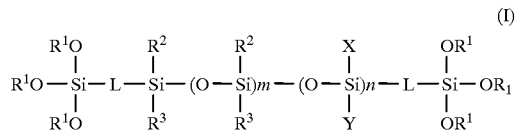

In formula (I), $R^1$ represents a methyl group, an ethyl group or a propyl group, preferably a methyl group in terms of the curing characteristics; and $R^2$ and $R^3$ each represents an unsubstituted or substituted alkyl, alkenyl or aryl group having 1 to 10 carbon atoms. Furthermore, the diorganopolysiloxane of component (A) may be either a homopolymer having the same repeating unit or a copolymer containing the different repeating units in which $R^2$ and $R^3$ are different. In terms of ink repellency, however, it is preferred that 60% or more of $R^2$ and $R^3$ are a methyl group, a vinyl halide group, or a phenyl halide group. X and Y each represents an unsubstituted or substituted alkyl, alkenyl or aryl group having 1 to 10 carbon atoms, or a group represented by the following formula (II) or (III). X and Y may be the same or different, but at least one of X and Y is selected from the following formula (II) or (III):

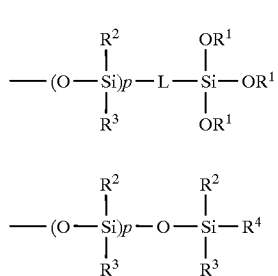

In formula (III), $R^4$ is an unsubstituted or substituted alkyl, alkenyl or aryl group having 1 to 10 carbon atoms. In formula (I), m is an integer of 5 or more, and n is an integer of 0 or more. In formulas (II) and (III), p is an integer of 0 or more. In formulas (I) and (II), L is a divalent connecting group, such as —O— or an unsubstituted or substituted alkylene group having 1 to 10 carbon atoms. The plurality of $R^1, R^2, R^3, R^4$, X, Y, and L may be the same or different. The number average molecular weight of component (A) is 3,000 to 1,000,000, more preferably 5,000 to 200,000. If it is less than 3,000, the coated film is markedly hard, resulting in poor press life and ink repellency. If it is more than 1,000,000, the curing characteristics of the coated film are poor.

Component (B) (Condensation catalyst):

The condensation catalyst for use in the present invention can be selected from known catalysts such as carboxylates of metals (for example, tin, titanium, zinc, lead, calcium, manganese, e.g., dibutyltin acetate, dibutyltin octylate, dibutyltin laurate, tetrabutyl titanate, tetra-2-ethylhexyl titanate, triethanolamine titanate, tetraisopropenyloxy titanate, lead octylate, lead naphthenate), and chloroplatinic acid.

These components (B) may be used either alone or as a combination of two or more of them. The content thereof is 0.1 to 50 parts by weight, preferably 0.5 to 10 parts by weight, based on 100 parts by weight of component (A).

Other components:

The silicone rubber layer may contain an alkoxysilane compound represented by the following formula (IV) or an oligomer provided by condensation of 2 to 10 molecules thereof, if necessary.

wherein $R^5$ represents an alkyl, alkenyl or aryl group having 1 to 10 carbon atoms; $R^6$ represents a methyl group, an ethyl group or a propyl group; and u and v are an integer of 0 to 4, with the proviso that u+v is 4, and v represents an integer of 2 or more. v is preferably 3 or more, and more preferably 3. Examples of the alkoxysilane compound include tetramethoxysilane, methyltrimethoxysilane, isobutyltrimethoxysilane, decyltrimethoxysilane, vinyltrimethoxysilane, phenyl trimethoxysilane, dimethyldimethoxysilane, diphenyldimethoxysilane, tetraethoxysilane, methyltriethoxysilane, vinyltriethoxysilane, phenyltriethoxysilane, dimethyldiethoxysilane, diphenyldiethoxysilane, tetrapropoxysilane, methyltripropoxysilane, vinyltripropoxysilane, phenyltripropoxysilane, dimethyldipropoxysilane and diphenyldipropoxysilane. Examples of the oligomer provided by condensation of 2 to 10 molecules thereof include oligomers represented by the following formulae (V) to (IX). Furthermore, partially hydrolyzed products thereof also give the same effect. However, they are not limited thereto.

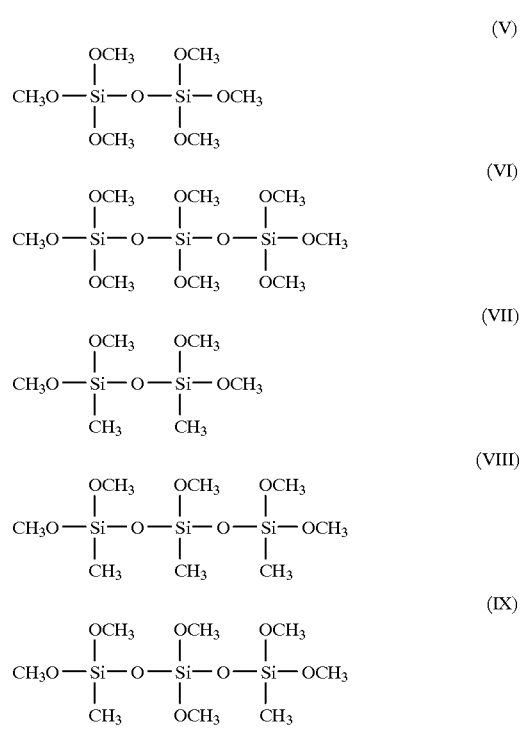

By adding the alkoxysilane or the oligomer thereof, the aging stability of the coating solution for the silicone rubber layer, and the curing characteristics of the coated film can be improved.

Furthermore, inorganic fine powders (e.g., silica, calcium carbonate, titanium oxide), adhesive auxiliaries (e.g., silane coupling agents, titanate coupling agents, aluminum coupling agents), photopolymerization initiators, aromatic group-substituted polydimethylsiloxanes (as disclosed in JP-A-1-179047) and silicone oil may be added.

Coating solvent:

Coating solvent for the silicone rubber layers for use in the present invention include aliphatic hydrocarbons such as pentane, hexane, heptane, "Isopar E, G, H" (manufactured by Esso Chemical Co., Ltd.), gasoline and kerosine. Furthermore, a high polar solvent can also be added within a limit of 20 parts by weight to the above solvents mainly composed of aliphatic hydrocarbons. Examples of the high polar solvent include water, alcohols, esters, ketones, ethers, aromatic hydrocarbons and carboxylic acids.

The silicone rubber layer of the present invention can be obtained by forming the coated film by using the coating solution containing the coating solvent and above-mentioned components, and drying the coated films. The drying is preferably conducted at 50 to 170° C. for 30 seconds to 5 minutes.

If the thickness of the silicone rubber layer for use in the present invention is too thin, the ink repellency is decreased so as to cause easy development of scratches. On the other hand, if the thickness is too thick, the developing characteristics are deteriorated. The thickness is therefore preferably 0.5 to 5 g/m², and more preferably 1 to 3 g/m².

In the waterless lithographic printing plates of the present invention, various ink-repellent layers may be coated on the silicone rubber layer. Furthermore, an intermediate layer may be provided between the sensitive material layer and the silicone rubber layer for enhancing the adhesive force between the sensitive material layer and the silicone rubber layer or preventing poisoning of the catalyst contained in the silicone rubber layer composition.

Cover film:

In order to protect a surface of the silicone rubber layer, the silicone rubber layer may be laminated with a transparent film such as polyethylene, polypropylene, polyvinyl chloride, polyvinylidene chloride, polyvinyl alcohol, polyethylene terephthalate and cellophane films, or may be coated with polymers. Oriented films may be used as such films. Furthermore, the matte treatment may be applied to these films to improve the vacuum adhesion to printing frames in image exposing, and contact faces of the films with the silicone rubber layers may be coated in order to improve the separating property thereof.

Next, the substrate for use in the present invention is explained.

Substrate:

The waterless lithographic printing plate solution of the present invention has such pliability as to be set on an ordinary printing machine and at the same time withstand the printing pressure in printing. Accordingly, examples of the substrate for use in the present invention include coated paper, metal plates such as an aluminum plate, plastic films such as a polyethylene terephthalate film, rubber and composites thereof (e.g., paper sandwiched between a pair of aluminum sheets). Preferred substrates are aluminum and aluminum alloys, such as alloys of aluminum with silicon, copper, manganese, magnesium, chromium, zinc, lead, bismuth or nickel.

Before an aluminum plate is used as a substrate, the plate is subjected to degreasing by showering or dipping in an aqueous acid solution in order to remove rolling oil from its surface. While any of acids known as degreasing agents for metals may be used, sulfuric acid or phosphoric acid is preferred. The acid processing is preferably followed by washing with water for an appropriate time. If desired, the degreased aluminum plate may be subjected to surface processing, such as graining, anodizing, or processing with an aqueous solution of silicate, e.g., sodium silicate or potassium silicate (that is, silicate processing). Among these, the silicate processing is preferred. In order to improve adhesion to a coating film, the substrate may be further processed with a silane coupling agent.

In the waterless lithographic printing plate of the present invention, a primer layer may coated just on the substrate. Next, the primer layer is explained below.

Primer Layer:

If desired, a primer layer may be provided between a substrate and a photosensitive layer. As a primer layer for use in the present invention, various primers can be selected for particular purposes, such as improvement of adhesion between a substrate and a photosensitive layer, antihalation, dyeing of an image area, and improvement of printing characteristics. Examples of the primer layer include a layer formed by applying a photosensitive polymer of various kinds and exposing the polymer to cure before forming a photosensitive layer as disclosed in JP-A-60-22903; a layer formed by thermosetting an epoxy resin as disclosed in JP-A-62-50760; a layer formed by hardening gelatin as disclosed in JP-A-63-133151; a layer formed by using a urethane resin and a silane coupling agent as disclosed in JP-A-3-200965; and a layer formed by using a urethane resin disclosed in JP-A-3-273248. A hardened film of gelatin or casein is also effective as a primer layer. To soften a primer layer, the above-mentioned primer layer may contain a polymer having a glass transition point of room temperature or less, such as polyurethane, polyamide, styrene-butadiene rubber, carboxy-modified styrene-butadiene rubber, acrylonitrile-butadiene rubber, carboxy-modified acrylonitrile-butadiene rubber, polyisoprene, acrylate rubber, polyethylene, chlorinated polyethylene or chlorinated polypropylene. The amount added of the polymer is arbitrary. It is possible to form a primer layer solely of these polymers as long as the coating solution has film-forming properties. The primer layer may further contain various additives meeting the above-mentioned purposes, for example dyes, pH indicators, printing-out agents, photopolymerization initiators, adhesion assistants (e.g., polymerizable monomers, diazo resins, silane coupling agents, titanate coupling agents, aluminum coupling agents), pigments (e.g., titanium dioxide), and silica powder. The primer layer may be hardened or cured on exposure to light after application. The primer layer is applied to a dry thickness of from 0.1 to 20 $g/m^2$, preferably from 1 to 10 $g/m^2$.

Then, the sensitive material layer is described. The sensitive material layer for use in the present invention includes a photosensitive layer and a thermal-sensitive layer. First, the photosensitive layer and the developing method thereof are illustrated.

Photosensitive layer:

The photosensitive layer for use in the present invention may be any photosolubilization-photosensitive layers or photoinsolubilaization-photosensitive layers, as long as they produce changes in solubility in developing solutions and in adhesive force to the silicone rubber layer before and after exposure. Specifically, examples of the photosolubilization-photosensitive layers include photosensitive layers comprising an o-quinoneazide compound, an o-nitrobenzylcarbinol ester compound usually used in positive presensitized (PS) plates, wipe-on plates, and photoresists; photosensitive layers comprising a complex of a diazo compound with an inorganic or organic acid; and photosensitive layers comprising an acid-generating agent and a compound having an acid-decomposable group. Furthermore, photoseparation-photosensitive layers are also used which are obtained by crosslinking the photosolubilization-photosensitive compound with a multifunctional compound to make them slightly soluble or insoluble in the developing solution.

The photoinsolubilization-photosensitive layers include photopolymerizable photosensitive layers, photocrosslinking photosensitive layers and photosensitive layers comprising a diazo resin and a binder resin.

The o-quinoneazide compound is a compound having at least one o-quinonediazido group, preferably at least one o-benzoquinonediazido group or o-naphthoquinonediazido group, and includes known compounds having various structures, for example, compounds described in J. Coser, *Light Sensitive Systems*, pages 339 to 353, John Wiley and Sons (1965). For example, they include esters of various hydroxyl compounds and benzoquinone-1,2-diazidosulfone, naphthoquinone-1,2-diazidosulfone, or other sulfonates. The hydroxyl compounds include condensed resins of phenols such as phenol, cresol and pyrogallol and carbonyl group-containing compounds such as formaldehyde, benzaldehyde and acetone, particularly resins obtained by condensation in the presence of acidic catalysts.

Examples of the complex of a diazo compound with inorganic or organic acid include a photosensitive complex of diazophenylamine and phosphotungstic acid.

Of the photosensitive layers containing a acid-generating agent and a compound having an acid-decomposable group, the compound having an acid-decomposable group include o-carboxylic acids and acetal. These photosensitive layer compositions are described in, for example, U.S. Pat. Nos. 4,101,323, 4,247,611, and 4,311,782.

The photopolymerizable photosensitive layer of the present invention comprises at least (1) a monomer, oligomer or macromonomer each having at least one photopolymerizable ethylenic unsaturated group, (2) a photopolymerization initiator, and (3) a film-formable polymer.

Component (1): Monomer, oligomer or macromonomer each containing at least one photopolymerizable ethylenic unsaturated group:

Examples of the monomer, oligomer and macromonomer include (1) acrylic or methacrylic acid esters of alcohols (for example, ethanol, propanol, hexanol, 2-ethylhexanol, glycerine, hexanediol, trimethylolpropane, pentaerythritol, sorbitol, triethylene glycol, (poly)ethylene glycol, (poly) propylene glycol; ethylene oxide, propylene oxide or their mixed adducts of, e.g., glycerine, hexanediol, trimethylolpropane, pentaerythritol, sorbitol);

(2) reaction products of amines (for example, ethylamine, butylamine, benzylamine, ethylenediamine, hexamethylenediamine, diethylenetriamine, xylylenediamine, ethanolamine, aniline, oxyethylenediamines oxypropylenediamines described in JP-A-6-118629, and adducts of xylylenediamine and ethylene oxide described in Japanese Patent Application No. 6-328730) and glycidyl acrylate, glycidyl methacrylate or allylglycidyl;

(3) reaction products of carboxylic acids (for example, acetic acid, propionic acid, benzoic acid, acrylic acid, methacrylic acid, succinic acid, maleic acid, phthalic acid, tartaric acid and citric acid) and glycidyl acrylate, glycidyl methacrylate or allylglycidyl;

(4) amide derivatives (for example, acrylamide, N-methylolacrylamide, t-butylacrylamide, methylenebisacrylamide, diacetoneacrylamide, xylylenediacrylamide); and (5) styrene derivatives (for example, p-hydroxystyrene, p-methylolstyrene).

More specifically, they include urethane acrylates described in JP-B-48-41708, JP-B-50-6034 and JP-A-51-37193; polyester acrylates described in JP-A-48-64183, JP-B-49-43191 and JP-B-52-30490; multifunctional acrylates and methacrylates such as epoxy (meth)acrylates obtained by reacting epoxy resins with (meth)acrylic acids; and N-methylolacrylamide derivatives described in U.S. Pat. No. 4,540,649. Further, photocurable monomers and oligomers described in *Nippon Setchaku-zai Kyokaishi*, 20(7): 300–308 (1984) and macromonomers described in Dreyfuss, P. & Quirk, R. P., *Encycl. Polym. Sci. Eng.*, 7:551 (1987), *Kagaku Kogyo*, 38:56 (1987) and *Kobunshi Kakoh*, 35:262 (1986) can also be used. However, they are not limited thereto, and in the multifunctional monomers, unsaturated groups may exist as mixtures of acrylic, methacrylic, allyl, and vinyl groups. Furthermore, they may be used alone or in combination. The amount thereof used is 5 to 80 parts by weight, preferably 30 to 70 parts by weight, based on the total solid weight of the photopolymerizable photosensitive layer.

Component (2): Photopolymerizable initiator

The photopolymerization initiator for use in the present invention can be selected from compounds, either sensitized or non-sensitized, capable of generating radicals through photolysis. Specific but non-limiting examples of photopolymerization initiators include:

(a) benzophenone derivatives, such as benzophenone, dimethylaminobenzophenone, diethylaminobenzophenone, xanthone, anthrone, thioxanthone, acridone, 2-chloroacridone, 2-chloro-N-n-butylacridone, 2,4-diethylthioxanthone, and fluorenone;

(b) benzoin derivatives, such as benzoin, benzoin methyl ether, and benzoin ethyl ether;

(c) quinones, such as p-benzoquinone, β-naphthoquinone, and β-methylanthraquinone;

(d) sulfur compounds, such as dibenzyl disulfide and di-n-butyl disulfide;

(e) azo or diazo compounds, such as 2-azobisisobutyronitrile, 1-azo-bis-1-cyclohexanecarbonitrile, p-diazobenzylethylaniline, and Congo Red;

(f) halogen compounds, such as carbon tetrachloride, silver bromide, α-chloromethylnaphthalene, trihalomethyl-s-triazine compounds, and trihalomethyloxadiazole compounds; and (g) peroxides, such as benzoyl peroxide.

These initiators may be used either individually or as a combination of two or more thereof. The initiator is used in an amount of from 0.1 to 25%, preferably from 3 to 20%, by weight, based on all compositions in the photopolymerizable photosensitive layer.

Component (3): Film-formable polymeric compound

The film-formable polymeric compounds for use in the present invention include polymers or copolymers described below. (1) vinyl polymers, such as polyvinyl acetate, polyvinyl alcohol, polyvinyl butyral, polyvinyl methyl ether, polyvinyl chloride, polyethylene, and copolymers thereof;

(2) (meth)acrylate polymers, alkyl(meth)acrylamide polymers, such as polyethyl (meth)acrylate, polybutyl (meth)acrylate, poly-t-butylacrylamide, polydiacetonacrylamide, and copolymers thereof;

(3) unvulcanized rubber, such as natural rubber, polybutadiene, polyisobutylene, polyneoprene, and copolymers thereof;

(4) polyethers, such as polyethylene oxide, and polypropylene oxide;

(5) polyamides, such as copolymers of caprolactam, laurolactam, hexamethylenediamine, 4,4'-bis-aminocyclohexylmethane, 2,4,4-trimethylhexamethylenediamine, isophoronediamine, diglycols, isophthalic acid, adipic acid and sebacic acid;

(6) polyesters, such as a condensation product between terephthalic acid or adipic acid and ethylene glycol or 1,4-butanediol; and (7) polyurethanes, such as those obtained from hexamethylene diisocyanate, tolylene diisocyanate, naphthalene-1, 5-diisocyanate or isophorone diisocyanate and ethylene glycol, 1,4-butanediol or polyester.

Isophoronediamine or hexamethylenediamine may be used as a chain extender.

Additionally, high polymers having a photopolymerizable or photo-crosslinkable olefinically unsaturated double bond on their side chain(s) can also be used as film-formable polymeric compounds.

The above-mentioned polymeric compounds may be used either individually or as a combination of two or more thereof. They are used in an amount of from 10 to 90%, preferably from 25 to 75%, by weight based on all compositions in the photopolymerizable photosensitive layer.

Other Components:

In addition to the aforesaid components, a thermal polymerization inhibitor is preferably contained. Example thereof include hydroquinone, p-methoxyphenol, di-t-butylp-cresol, pyrogallol, t-butyl catechol, 4,4'-thiobis(3-methyl-6-t-butylphenol), 2,2'-methylenebis(4-methyl-6-t-butylphenol), and 2-mercaptobenzimidazole. For the purpose of coloring the photopolymerizable photosensitive layer, the composition may contain a dye or a pigment or, as a printing-out agent, a pH indicator or a leuco dye. According to the end use, the composition may further contain a small amount of a silicone compound, such as polydimethylsiloxane, methylstyrene-modified polydimethylsiloxane, olefin-modified polydimethylsiloxane, polyether-modified polydimethylsiloxane, a silane coupling agent, silicone diacrylate, or a silicone dimethacrylate. A silicone surfactant or fluorine surfactant may be added for the improvement of coating properties. A diazo resin may be added for the improvement of adhesion of a photopolymerizable photosensitive layer and a primer layer. Further, a plasticizer for the improvement of softness (e.g., polyethylene glycol, polypropylene glycol, tricresyl phosphate) or a stabilizer (e.g., phosphoric acid) may be added. These additives are generally used in an amount of 10% or less by weight based on all compositions in the photopolymerizable photosensitive layer. Sometimes, hydrophobic silica powders having been processed with a (meth)acryloyl or allyl group-containing silane coupling agent may be added in an amount of 10% or less by weight based on all compositions in the photopolymerizable photosensitive layer.

Furthermore, the photocrosslinking photosensitive layer include layers mainly comprising photosensitive polymers such as polyesters, polyamides and polycarbonates having —CH=CH—CO— as a photosensitive group on the main chain or on side chains of the polymers. Examples thereof include photosensitive polyesters obtained by a polycondensation reaction of phenylenediacrylic acid or esters thereof and a polyhydric alcohol as described in JP-B-55-22781 and JP-A-55-40415; vinyl polymers having a maleimido group at side chains thereof as described in JP-A-64-35547; (2-propenylidene)malonic acid compounds such as cinnamylidene-malonic acid as described in U.S. Pat. No. 2,956,878; and photosensitive polyesters derived from difunctional glycols.

The diazo resin comprising diazo resins and binder resins for use in the photosensitive layer include condensation products of aromatic dizaonium salts and formaldehyde. Particularly preferred examples thereof include salts of condensation products of p-diazodiphenylamine and formaldehyde or acetaldehyde such as inorganic salts of diazo resins which are reaction products of hexafluorophosphates, tetrafluoroborates, perchlorates or periodates and the above-mentioned condensation products, and organic salts of diazo resins which are reaction products of the above-described condensation products and sulfonic acid derivatives as described in U.S. Pat. No. 3,200,309. In the present invention, the ratio of the diazo resin to the photosensitive layer is 20 to 95 parts by weight, and preferably 35 to 80 parts by weight.

Various high-molecular compounds can be used as the binder resin. However, preferred examples thereof include copolymers of a monomer having an aromatic hydroxyl group as described in JP-A-54-98613 (e.g., N-(4-hydroxyphenyl)-acrylamide, N-(4-hydroxyphenyl) methacrylamide, o-, m- or p-hydroxystyrene, o-, m- or p-hydroxyphenyl methacrylate) and other monomer; polymers containing a hydroxyethyl (meth)acrylate unit as a main repeating unit as described in U.S. Pat. No. 4,123,276; copolymer resins comprising a monomer unit having a phenolic hydroxyl group and a monomer unit having an alcoholic hydroxyl group as described in JP-A-3-158853; natural resins (e.g, shellac, rosin); polyvinyl alcohols; polyamide resins as described in U.S. Pat. No. 3,751,257; linear polyurethane resins as described in U.S. Pat. No. 3,660,097; phthalated polyvinyl alcohol resins; epoxy resins obtained by condensation of bisphenol A and epichlorohydrin; and cellulose derivatives (e.g., cellulose butylate, cellulose acetate).

The photocrosslinking photosensitive layer and the photosensitive layer comprising the diazo resin may also contain additives such as dyes, surfactants, plasticizers, and stabilizers.

The photosensitive layer composition for use in the present invention is dissolved in an appropriate solvent such as water, 2-methoxyethanol, 2-methoxyethyl acetate, propylene glycol methylethyl acetate, methyl lactate, propylene glycol monomethyl ether, ethanol, methyl ethyl ketone, N,N-dimethylacetamide, methyl pyruvate, ethyl pyruvate and methyl 3-methoxypropionate alone or in mixed solvents thereof, and coated on a substrate. The amount thereof coated after drying is preferably 0.1 to 20 g/m$^2$, and more preferably 0.5 to 10 g/m$^2$.

Development processing:

The waterless lithographic printing plate of the present invention using the photosensitive layer described herein is exposed through a transparent original, and then developed with a developing solution which can partly dissolve or swell the photosensitive layer of image areas (unexposed areas).

In the present invention, known developing solutions for waterless lithographic printing plates can be used as the developing solution. However, water or an aqueous solution of water-soluble organic solvent mainly comprising water is preferably used. Taking into account safety and inflammability, the concentration of the water-soluble solvent is preferably less than 40% by weight. Examples of the known solvents include aliphatic hydrocarbons (e.g., hexane, heptane, "Isopar E, G, H" (manufactured by Esso Kagaku Co.), gasoline, kerosine), aromatic hydrocarbons (e.g., toluene, xylene), and hydrocarbon halides (e.g., Trichlene) each containing the following polar solvents; and the following polar solvents.

The polar solvents include alcohols (e.g., methanol, ethanol, propanol, isopropanol, benzyl alcohol, ethylene glycol monomethyl ether, 2-ethoxyethanol, diethylene glycol monohexyl ether, triethylene glycol monomethyl ether, propylene glycol monoethyl ether, dipropylene glycol monomethyl ether, polyethylene glycol monomethyl ether, polypropylene glycol, tetraethylene glycol), ketones (acetone, methyl ethyl ketone), esters (ethyl acetate, methyl lactate, butyl lactate, propylene glycol monomethyl ether acetate, diethylene glycol acetate, diethyl phthalate), and others (triethyl phosphate, tricresyl phosphate).

In addition, a developing solution in which water is added to the organic solvent developing solution, a developing solution in which the organic solvent is solubilized in water by use a surfactant, and a developing solution in which an alkali agent (e.g., sodium carbonate, diethanolamine, sodium hydroxide) are further added thereto.

Furthermore, dyes such as Crystal Violet, Victoria Pure Blue and Astrazone Red can be added to the developing solution to dye image areas simultaneously with development.

The development can be conducted by known methods such as rubbing of plate faces with developing pads containing the developing solutions as described above, and rubbing of plate faces with developing brushes after pouring of the developing solutions on the plate faces. The temperature of the developing solution can be arbitrarily selected, but is preferably 10° C. to 60° C. The development removes the silicone rubber layer of the image areas to convert the areas to ink-repellent areas.

In order to confirm the thus obtained image forming characteristics of the printing plate, the exposed image area can be dyed with a dyeing solution to make the exposed image area detectable. When the developing solution does not contain the dye for dyeing the exposed image area, the area is treated with the dyeing solution after the development. Only the exposed image area of the photosensitive layer is dyed by softly rubbing the image area with a pad impregnated with the dyeing solution. It can be confirmed thereby whether the development is fully perplated to highlights or not. As the dyeing solution, a solution or a dispersion is used in which one or more dyes selected from water-soluble disperse dyes, acid dyes and basic dyes are dissolved or dispersed in a solvent such as water, alcohol, ketones or ethers, or in a mixed solvent of two or more of them. In order to improve the dye affinity, it is also effective to add carboxylic acids, amines, surfactants, dyeing auxiliaries, or antifoaming agents.

The printing plate dyed with the dyeing solution is preferably washed with water, followed by drying, which can remove the dye adhered to a non-image area or the back of the plate and inhibit the stickiness of the plate surfaces, resulting in improvement in handling characteristics of the printing plate.

When the thus treated printing plates are stored in piles, guard sheets are preferably inserted therebetween to protect the printing plates.

It is preferred that the development processing, the dyeing processing, the subsequent washing and drying as described above are conducted with an automatic processor. A preferred example of such an automatic processor is described in JP-A-2-22061.

Sensitive material layers other than photosensitive layer:

The sensitive material layers other than the photosensitive layer which are used in the present invention include discharge ablation image formation conductive layers described in JP-B-40-21879, JP-A-50-106509, and JP-W-4-501684 (the term "JP-W" as used herein means an "unexamined published international patent application"); laser ablation image formation thermally sensitive layers described in JP-B-40-21879, JP-A-6-55723, and JP-A-6-186750; thermal transfer image formation thermally sensitive layers described in JP-A-2-292043, JP-A-4-126295, JP-A-4-151292, and JP-A-4-263994; and thermal fusion image formation thermally sensitive layers described in JP-B-4-73715 and JP-A-1-192555.

The present invention is now illustrated in greater detail by way of the following examples, but it should be understood that the present invention is not to be construed as being limited thereto. In the following examples, all parts, percents, ratios and the like are by weight unless otherwise indicated.

EXAMPLES 1 TO 8

Waterless lithographic printing plates were produced in the following manner.

Primer layer:

An aluminum plate of JIS A 1050 having a thickness of 0.3 mm was degreased by the usual method, and immersed in a 1% aqueous solution of KBM603 (manufactured by Shin-Etsu Chemical Co. Ltd.), a silane coupling agent, followed by drying at room temperature. The aluminum plate was coated with the following coating solution to form primer layer to give a dry weight of 4 g/m$^2$, and dried at 140° C. for 2 minutes.

| | |
|---|---|
| Sanprene IB1700D (produced by Sanyo Chemical Industries, Ltd.) | 10 parts |
| Hexafluorophosphate of condensation product of p-diazodiphenylamine and paraformaldehyde | 0.1 parts |
| TiO$_2$ | 0.1 parts |
| MFC323 (produced by Dainippon Ink and Chemicals, Inc.) | 0.03 parts |
| Propylene glycol methyl ether acetate | 50 parts |
| Methyl lactate | 20 parts |
| Pure water | 1 part |

Then, the primer layer was exposed by 20 counts by using an FT26IV UDNS ULTRA-PLUS FLIPTOP PLATE MAKER vacuum exposing device manufactured by Nu Ark Company.

Photosensitive layer:

The aluminum plate on which the above primer layer was plated was coated with a photopolymerizable photosensitive solution having the following composition to give a dry weight of 3 g/m$^2$, and dried at 120° C. for 1 minute.

| | |
|---|---|
| Polyurethane resin (isophorone diisocyanate/polyester (adipic acid/1,4-butanediol/ethylene/glycol)/isophoronediamine) | 1.5 parts |
| Adduct of 1 mol of m-xylylene-diamine/4 mol of glycidyl methacrylate | 1.5 parts |
| Sartomer 9035 (produced by Somar Co.) | 0.3 parts |
| Polyethylene glycol (Mw = 400) | 0.05 parts |
| Ethyl Michler's ketone | 0.4 parts |
| 2,4-Diethylthioxanthone | 0.05 parts |
| 9-Fluorenone | 0.05 parts |
| Aizen Victoria Blue BHconc (produced by Hodogaya Chemical Co., Ltd.) | 0.01 parts |
| Fluorine surfactant (Megafac F177, manufactured by Dainippon Ink and Chemicals, Inc.) | 0.01 parts |
| Methyl ethyl ketone | 20 parts |
| Propylene glycol monomethyl ether | 20 parts |

Silicone rubber layer:

A condensation silicone rubber solutions having the following composition was prepared. Then, a 10 g sample was collected and allowed to stand to examine the gelation initiation time of the coating solutions. On the other hand, a 200 g sample was collected, and the viscosity of the coating solution was measured with stirring. The residual silicone rubber solution was applied over the above photopolymerizable photosensitive layer to give a dry weight of 2 g/m$^2$, and dried at 130° C. for 2 minutes. After drying, the degree of swelling of the cured silicone rubber layers with Isopar G (produced by Esso Chemical Co.) was measured.

| | |
|---|---|
| Polydimethylsiloxane having trialkoxysilyl groups at both ends shown in Table 1 | 9 parts |
| Condensation catalyst shown in Table 1 | (see Table 1) |
| Alkoxysilane compound or oligomer shown in Table 1 | (see Table 1) |
| Isopar G (produced by Esso Kagaku Co.) | 120 parts |

The thus obtained silicone rubber layer was laminated with a 12-μm thick biaxial oriented polypropylene film one side so that the surface of the film not matted was brought into contact with the silicone rubber layer, thereby obtaining a waterless lithographic printing plate of the present invention.

Comparative Examples 1 To 6

Silicone rubber layer:

After preparation of condensation type silicone rubber solutions having the following compositions, the gelation initiation time and the viscosity of the coating solutions, and the degree of swelling of the coated films were measured by the same methods as with Examples 1 to 8.

| | |
|---|---|
| α, ω-Dihydroxypolydimethylsiloxane (the degree of polymerization: about 900) | 9 parts |
| Dibutyltin octylate | (see Table 1) |
| Condensation crosslinking agent shown in Table 1 | (see Table 1) |
| Isopar G (produced by Esso Chemical Co.) | 120 parts |

The thus obtained silicone rubber layer was laminated with a polypropylene film in the same manner as in Examples 1 to 8 to obtain a comparative waterless lithographic printing plate.

TABLE 1

| | Polydimethylsiloxane | | | Condensation catalyst | | Condensation crosslinking Agent | | | |
|---|---|---|---|---|---|---|---|---|---|
| | (a) | | (b) | | | | | | |
| | Polymerization degree | | | | | | | | |
| | 700 | 500 | 900 | (c) | (d) | (e) | (f) | (g) | |
| Example 1 | 9.0 | 0 | 0 | 0.01 | 0 | 0 | 0 | 0 | |
| Example 2 | 9.0 | 0 | 0 | 0.02 | 0 | 0 | 0 | 0 | |
| Example 3 | 0 | 9.0 | 0 | 0.01 | 0 | 0 | 0 | 0 | |
| Example 4 | 4.5 | 4.5 | 0 | 0.01 | 0 | 0 | 0 | 0 | |
| Example 5 | 9.0 | 0 | 0 | 0 | 0.01 | 0 | 0 | 0 | |
| Example 6 | 9.0 | 0 | 0 | 0.01 | 0 | 1 | 0 | 0 | |
| Example 7 | 9.0 | 0 | 0 | 0.01 | 0 | 2 | 0 | 0 | |
| Example 8 | 9.0 | 0 | 0 | 0.01 | 0 | 0 | 1 | 0 | |

TABLE 1-continued

| | Polydimethylsiloxane | | | Condensation catalyst | | Condensation crosslinking Agent | | | |
|---|---|---|---|---|---|---|---|---|---|
| | (a) | | (b) | | | | | | |
| | Polymerization degree | | | | | | | | |
| | 700 | 500 | 900 | (c) | (d) | (e) | (f) | (g) | |
| Comp. Example 1 | 0 | 0 | 9.0 | 0.01 | 0 | 1 | 0 | 0 | |
| Comp. Example 2 | 0 | 0 | 9.0 | 0.02 | 0 | 1 | 0 | 0 | |
| Comp. Example 3 | 0 | 0 | 9.0 | 0.01 | 0 | 2 | 0 | 0 | |
| Comp. Example 4 | 0 | 0 | 9.0 | 0.01 | 0 | 0 | 0 | 1 | |
| Comp. Example 5 | 0 | 0 | 9.0 | 0.02 | 0 | 0 | 0 | 1 | |
| Comp. Example 6 | 0 | 0 | 9.0 | 0.01 | 0 | 0 | 0 | 2 | |

Notes:
(a): Trimethoxysilyl at both ends
(b): Hydroxysilyl at both ends
(c): Dibutyltin octylate
(d): Tetrabutyl Titanate
(e): Methyltrimethoxysilane
(f): 3:7 Mixture of oligomers represented by formulas (VII) and (VIII)
(g): Methyltriacetoxysilane For these printing plates, every sheet was superimposed on a positive film having a halftone dot image of 200 lines/inch and a gray scale (G/S) having a optical density difference of 0.15, and exposed by 20 counts by using an FT26IV UDNS ULTRA-PLUS FLIPTOP PLATE MAKER vacuum exposing device manufactured by Nu Ark Company. Then, the laminated film was peeled off, and immediately subjected to the following development processing.

Development processing:

The printing plates were immersed in water at 35° C., and rubbed with a developing pad to remove the silicone rubber layers of the unexposed areas. Subsequently, the plates were dyed with a dyeing solution having the following composition, and the sensitivity (G/S clear sensitivity) and the dot reproduction (halftone dot area of reproducible highlights, unit: %) were evaluated.

(Dyeing Solution)

| | |
|---|---|
| Crystal Violet | 0.1 parts |
| Diethylene Glycol Monoethyl Ether | 15 parts |
| Pure Water | 85 parts |

TABLE 2

| | Coating solution for silicone rubber layer | | Silicone rubber layer | Pressing properties | |
|---|---|---|---|---|---|
| | 10 g, Still standing sample | 200 g, Stirring sample Solution viscosity (cps) | coated film lubrication | | Dot reproduction (%) |
| Sample | Gelation initiation time | Just after preparation / After 10 hr | degree (%) | Sensitivity | |
| Example 1 | 10 hr or more | 3.0 / 3.0 | 160 | 8 | 2 |
| Example 2 | 10 hr or more | 3.0 / 3.0 | 155 | 8 | 2 |

TABLE 2-continued

| Sample | Coating solution for silicone rubber layer 10 g, Still standing sample Gelation initiation time | 200 g, Stirring sample Solution viscosity (cps) Just after preparation | After 10 hr | Silicone rubber layer coated film lubrication degree (%) | Pressing properties Sensitivity | Dot reproduction (%) |
|---|---|---|---|---|---|---|
| Example 3 | 10 hr or more | 2.4 | 2.4 | 150 | 9 | 2 |
| Example 4 | 10 hr or more | 2.7 | 2.7 | 155 | 8 | 2 |
| Example 5 | 10 hr or more | 3.0 | 3.0 | 160 | 8 | 2 |
| Example 6 | 10 hr or more | 3.0 | 3.0 | 160 | 8 | 2 |
| Example 7 | 10 hr or more | 3.0 | 3.0 | 165 | 9 | 3 |
| Example 8 | 10 hr or more | 3.0 | 3.0 | 155 | 8 | 2 |
| Comparative Example 1 | 10 hr or more | 3.8 | 3.8 | curing failed | — | — |
| Comparative Example 2 | 10 hr or more | 3.8 | 3.8 | curing failed | — | — |
| Comparative Example 3 | 10 hr or more | 3.8 | 3.8 | curing failed | — | — |
| Comparative Example 4 | after 2 hr | 3.8 | 8.5 | 160 | 9 | 3 |
| Comparative Example 5 | after 1 hr | 3.8 | 8.9 | 150 | 9 | 3 |
| Comparative Example 6 | after 3 hr | 3.8 | 7.4 | 150 | 7 | 2 |

The results in Table 2 show that the waterless lithographic printing plates of the present invention are significantly improved in aging stability of the coating solutions for the silicone rubber layers while keeping good curing properties of the coated silicone rubber films, sensitivity and dot reproducibility.

According to the present invention, gelation of the polysiloxanes caused by condensation in the coating solutions is inhibited, and the waterless lithographic printing plates excellent in aging stability of the coating solutions for the silicone rubber layers.

While the invention has been described in detail and with reference to specific embodiments thereof, it will be apparent to one skilled in the art that various changes and modifications can be made therein without departing from the spirit and scope thereof.

What is claimed is:

1. A lithographic printing plate requiring no fountain solution comprising a substrate having coated over a complete surface thereof a silicone rubber layer, wherein a photosensitive layer is present between the substrate and the silicone rubber layer and wherein the silicone rubber layer comprises
    (A) 100 parts by weight of a linear diorganopolysiloxane having a trialkoxysilyl group at least at both ends, and
    (B) 0.1 to 10 parts by weight of a condensation catalyst.
2. The lithographic printing plate requiring no fountain solution as claimed in claim 1, wherein the linear diorganopolysiloxane is represented by the following formula (I):

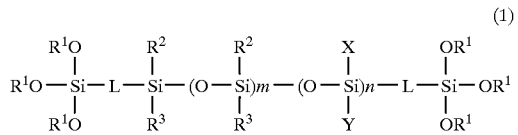

(I)

wherein $R^1$ represents a methyl group, an ethyl group, or a propyl group;
$R^2$ and $R^3$ are the same or different and each represents an alkyl group, an alkenyl group, or an aryl group;

X and Y are the same or different and each represents a substituted or unsubstituted alkyl, alkenyl, aryl group, or a group represented by the following formula (II) or (III):

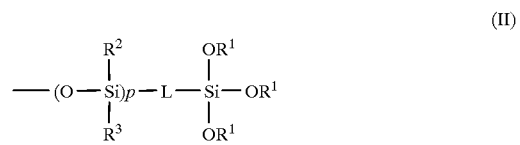

(II)

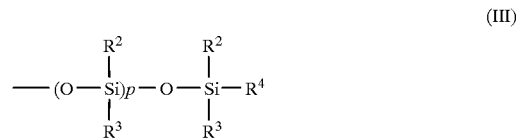

(III)

wherein $R^4$ represents an alkyl group, an alkenyl group, or an aryl group;
L represents a divalent connecting group;
m represents an integer of 5 or more;
n represents an integer of 0 or more; and
p represents an integer of 0 or more.

3. The lithographic printing plate requiring no fountain solution as claimed in claim 1, wherein the linear diorganopolysiloxane has a number average molecular weight of 3,000 to 1,000,000.

4. The lithographic printing plate requiring no fountain solution as claimed in claim 1, wherein the condensation catalyst is a carboxylate of a metal or chloroplatinic acid.

5. The lithographic printing plate requiring no fountain solution as claimed in claim 1, wherein the condensation catalyst is selected from the group consisting of dibutyltin acetate, dibutyltin octylate, dibutyltin laurate, tetrabutyl titanate, tetra-2-ethylhexyl titanate, triethanolamine titanate, tetraisopropenyloxy titanate, lead octylate, and lead naphthenate.

6. The lithographic printing plate requiring no fountain solution as claimed in claim 1, wherein the condensation catalyst is used in an amount of 0.5 to 10 parts by weight based on 100 parts by weight of the linear diorganopolysiloxane.

7. The lithographic printing plate requiring no fountain solution as claimed in claim 1, wherein the silicone rubber layer further contains an alkoxysilane compound represented by the following formula (IV) or an oligomer provided by condensation of 2 to 10 molecules thereof:

$$(R^5)_u.Si.(OR^6)_v \qquad (IV)$$

wherein $R^5$ represents an alkyl group, an alkenyl group, or an aryl group;

$R^6$ represents a methyl group, an ethyl group or a propyl group; and with the proviso that u+v is 4, and v represents an integer of 2 or more.

8. The lithographic printing plate requiring no fountain solution as claimed in claim 7, wherein the alkoxysilane compound represented by formula (IV) is selected from the group consisting of tetramethoxysilane, methyltrimethoxysilane, isobutyltrimethoxysilane, decyltrimethoxysilane, vinyltrimethoxysilane, phenyltrimethoxysilane, dimethyldimethoxysilane, diphenyldimethoxysilane, tetraethoxysilane, methyltriethoxysilane, vinyltriethoxysilane, phenyltriethoxysilane, dimethyldiethoxysilane, diphenyldiethoxysilane, tetrapropoxysilane, methyltripropoxysilane, vinyltripropoxysilane, phenyltripropoxysilane, dimethyldipropoxysilane, and diphenyldipropoxysilane.

* * * * *